(12) United States Patent
Bailey, III et al.

(10) Patent No.: US 7,130,767 B2
(45) Date of Patent: Oct. 31, 2006

(54) COMPUTER-IMPLEMENTED DATA PRESENTATION TECHNIQUES FOR A PLASMA PROCESSING SYSTEM

(75) Inventors: Andrew D. Bailey, III, Pleasanton, CA (US); Puneet Yadav, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 43 days.

(21) Appl. No.: 10/951,551

(22) Filed: Sep. 27, 2004

(65) Prior Publication Data
US 2006/0074590 A1    Apr. 6, 2006

(51) Int. Cl.
*G06F 11/32* (2006.01)

(52) U.S. Cl. ............ 702/182; 702/179; 702/180; 702/181; 702/183; 702/184; 702/185

(58) Field of Classification Search ........ 702/179–185; 345/581; 156/345.24; 707/101
See application file for complete search history.

(56) References Cited

U.S. PATENT DOCUMENTS

| | | | | |
|---|---|---|---|---|
| 5,576,629 A | * | 11/1996 | Turner et al. | 324/709 |
| 5,759,424 A | * | 6/1998 | Imatake et al. | 216/60 |
| 6,222,540 B1 | * | 4/2001 | Sacerdoti | 345/581 |
| 6,273,023 B1 | * | 8/2001 | Tsuchihashi et al. | 118/723 E |
| 6,301,547 B1 | * | 10/2001 | Felps | 702/67 |
| 6,304,670 B1 | | 10/2001 | Berestov | |

(Continued)

OTHER PUBLICATIONS

Bainbridge, Lisanne, "Planning the training of a complex skill," pp. 1-17, http:www.banbrdg.demon.co.uk/Papers/PlanTrain.html.

(Continued)

*Primary Examiner*—Carol S. Tsai
*Assistant Examiner*—Phuong Huynh
(74) *Attorney, Agent, or Firm*—IP Strategy Group, P.C.

(57) ABSTRACT

A computer-implemented data presentation technique for presenting a set of expected failure states of system-related constructs pertaining to a plasma processing system is disclosed. The technique includes receiving a set of indicia pertaining to a first system-related construct of said system-related constructs. The technique also includes computing, in accordance with a first sub-method and responsive to said receiving said first set of indicia, a first expected failure state value. The technique further includes computing a first normalized expected failure state value in accordance with a first weight; correlating said first normalized expected failure state value to a first color; and displaying said first color in a cell of an n-dimensional matrix, wherein n is a number greater than 1.

31 Claims, 5 Drawing Sheets

U.S. PATENT DOCUMENTS

| | | | |
|---|---|---|---|
| 6,473,080 B1 | 10/2002 | Brown et al. | |
| 6,477,685 B1* | 11/2002 | Lovelace | 716/4 |
| 6,529,900 B1 | 3/2003 | Patterson et al. | |
| 6,615,211 B1 | 9/2003 | Beygelzimer et al. | |
| 6,629,097 B1 | 9/2003 | Keith | |
| 6,707,454 B1 | 3/2004 | Barg et al. | |
| 6,711,577 B1* | 3/2004 | Wong et al. | 707/101 |
| 6,714,893 B1* | 3/2004 | Busche et al. | 702/181 |
| 6,750,864 B1 | 6/2004 | Anwar | |
| 6,754,660 B1* | 6/2004 | MacPhail | 707/100 |
| 2003/0136511 A1* | 7/2003 | Balasubramhanya et al. | 156/345.25 |

OTHER PUBLICATIONS

Meyers et al., "Building Data Visualization for Diagnostics, Operator Feedback, and Performance Optimization," ASHRAE Journal, Jun., pp. 63-73 (total 12 pages), http://eetd.lbl.gov/ea/mills/emills/pubs/DV/Data_Vis.html.

Chaturvedi et al., "Visualization of Information in 3D," 9 pages total, http://www.cba.ufl.edu/dis/caims/3div.html.

PCT International Search Report, mailed Feb. 7, 2006, Intl App No. PCT/US05/34427.

PCT Written Opinion, mailed Feb. 7, 2006, Intl App No. PCT/US05/34427.

* cited by examiner

COMPUTER-IMPLEMENTED DATA PRESENTATION TECHNIQUES FOR A PLASMA PROCESSING SYSTEM

BACKGROUND OF THE INVENTION

The present invention relates in general to substrate manufacturing technologies and in particular to computer-implemented data presentation techniques for a plasma processing system.

Semiconductor fabrication facilities often cost billions of dollars to design and operate. Optimizing throughput and decreasing costs are therefore critical for profitability. Capital equipment processing systems within these facilities, however, often require significant human manual intervention creating the potential for process variances or even outright operation mistakes.

Most substrate capital equipment processing systems are normally controlled by sophisticated computers comprising operating software programs, wherein users via an interface are provided the ability to send requests to the equipment and receive output information from the equipment. Often thousands of process measurements (i.e., sequentially measured electromagnetic emission spectra during a target etch step) are periodically measured and subsequently transformed to a smaller set of aggregate variables that correlate to a system parameter of interest (i.e., such as whether a chuck must be replaced).

However, efficiently analyzing, summarizing, and displaying process information in a format that is both understandable and actionable to the operator, while the substrate is being processed, may be problematic. In general, the plasma process is dynamic and hence difficult to monitor. For example, residual may build up on the chamber walls changing the chemical properties of the plasma, or plasma damage may occur to chamber structures altering the electrical characteristics of the process, etc.

Plasma processing equipment is commonly configured with some type of discrete visual notification or alarm device that notifies the operator as to whether the system is ready for operation. A basic, although common, type of notification system comprises a series of lights coupled to the processing system and corresponding to a machine readiness state. Green may signify a "go" state. Red may signify a "no go" state. And yellow may signify a meta-state somewhere in between a "go" and "no go" state, although a yellow and red state are often both treated as a "no go" state.

Referring now to FIG. 1, a simplified diagram of a light tower as is commonly used with plasma processing systems is shown. Light tower status can generally be determined by a process model—usually an "OR" on software and/or hardware alarm thresholds. The light tower itself may be comprised of three discrete color displays, and hence can display three states. A red state 102, generally implies a "no go" machine readiness state, such as a when the plasma process is out of spec. In some configurations, a "no go" machine readiness state will cause the red display to flash. A yellow state 104 generally conveys a warning that the plasma process may soon be approaching a "no go" machine readiness state. A green state 106 generally refers to a "go" state. In general, operators require only a modest knowledge of the process model, unless substantial troubleshooting is required.

However, machine readiness state is somewhat arbitrary and commonly determined from a subset of process parameters that are of particular interest to the plasma processing system owner. Generally, the manufacturing process is stopped only when absolutely necessary, since a single processed substrate can be worth a substantial amount of money. Yet, it is often difficult to achieve a sufficient granularity of the machine process state to make more than what amounts to an educated guess.

For example, pollutants may be cleaned from the plasma processing system by striking the plasma without the substrate. However, since the electrostatic chuck (chuck) is no longer shielded by the substrate, it is subsequently etched. Eventually, the plasma processing system cannot adequately compensate, and the process recipe's parameters are invalidated. Since it is often impractical to determine when this point is exactly reached, the customer may instead determine that a "no go" state is reached, and hence the chuck replaced, after a certain amount of operational hours, which in practice is normally only a fraction of its useful life. This can both increase productions costs, since an expensive chuck may be needless replaced, and reduces yield, since the plasma processing system must be taken offline for several hours to replace the chuck.

In addition, machine readiness may not necessarily correlate to a "go" or "no go" state, but rather to a continuum of expected failure states. An expected failure state is the probability of a particular failure state multiplied by some numerical representation of its impact, damage, or normalized weight. If a failure is highly probable, but its operational impact on the process is negligible, its expected value is small. In this situation, the manufacturing process should probably be continued. Likewise, if a failure is not very probable, but its operational impact on the process is very high, a low expected value may again suggest allowing the process to continue. In contrast, a higher expected failure state may suggest immediately shutting down the machine. For example, a vacuum leak in the plasma chamber.

However, a continuum of expected failure states can be difficult to efficiently present to the operator in a readily comprehensible graphical user display. Although limited, a benefit of a discrete visual notification (i.e., "go" or "no go") is that it allows the operator to quickly and easily react, such as stopping the plasma processing system. In contrast, a continuum visual notification may often require operators to engage in sophisticated thinking, such as building up mental overviews of the present and future state of affairs in the plasma process, and of the effects of possible actions.

A significant fraction of data analysis models (like regression models, factor analysis, analysis of variances, etc.) tend to be comprehensible to the operator only if the data follows a simple pattern. Yet, it is often difficult to extract raw operational data from a plasma processing system, process that information based on a pre-defined set of algorithms, and subsequently display the processed information in a readily comprehensible graphical display. In addition, operators may need to understand enough about the process and the task to be able to infer the present inner state of a complex multidimensional process from an incomplete graphical display, and to predict its behavior and hence possible failure states.

In view of the foregoing, there are desired computer-implemented data presentation techniques for a plasma processing system.

SUMMARY OF THE INVENTION

The invention relates, in one embodiment, in a plasma processing system, including a plasma processing chamber, to a computer-implemented data presentation technique for presenting a set of expected failure states of system-related constructs pertaining to a plasma processing system. The technique includes receiving a set of indicia pertaining to a first system-related construct of the system-related constructs. The technique also includes computing, in accordance with a first sub-method and responsive to the receiving the first set of indicia, a first expected failure state value. The technique further includes computing a first normalized expected failure state value in accordance with a first weight; correlating the first normalized expected failure state value to a first color; and displaying the first color in a cell of an n-dimensional matrix, wherein n is a number greater than 1.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
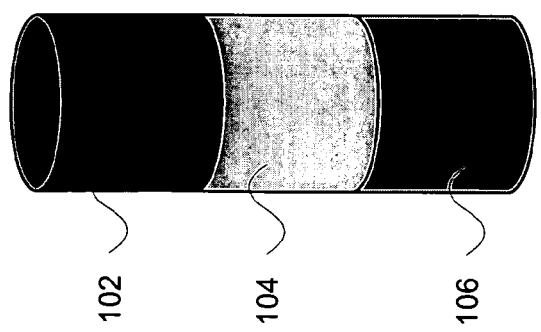
FIG. 1 shows a simplified diagram of a light tower as is commonly used with plasma processing systems.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

As previously stated, it is often difficult to extract raw operational data from the plasma processing system, process that information based on a pre-defined set of algorithms, and subsequently display the processed information in a readily comprehensible graphical display.

In a non-obvious way, a set of plasma processing measurements can be modeled as a set of substantially continuous expected failure states, each of which can be mapped to a color that is displayed to the operator. That is, faults and alarms generated by modules or systems within a plasma processing system may be detected and subsequently displayed in the form of a color. An expected failure state is the numerical probability of a particular failure state multiplied by a numerical representation of its impact, damage, or other normalized weight. If a failure is highly probable, but its operational impact on the processes is negligible, its expected value and hence impact is small. In contrast, a higher expected failure state may suggest immediately shutting down the machine.

Visual representation is remarkably good at identifying interesting patterns and spatial relationships, and hence has become increasingly important in conveying and interpreting information from a large amount of data. In general, the human eye performs significantly better in identification of patterns in visual presentation of data than a computer. Since much of the plasma processing data may contain irregular and localized patterns, a visual representation of such data is likely to prove more amenable for rapid analysis than the same data in a numerical tabular form. In communicating the relationships in a tabular format, users not only have to convey the data but the interpretation as well. For example, whether a piece of data or a set of data requires a user to halt the plasma process.

A color spectrum, ranging from a minimum to a maximum expected failure state value, may subsequently be created. In one embodiment, a constructible sub-method by sub-method is used to derive each expected failure state model. A sub-method is a mathematical transformation or model of a set of measurements that is created from a system-related construct, or from other sub-methods, and is used to determine an expected failure state.

In general, a system-related construct is a set of measured attributes related to some portion of the plasma processing system, such as a sub-component. A system-related construct may also be an external attribute that is affected by the plasma processing system, such as operational cost. Examples of sub-components include an electrostatic chuck, a matching network, a gas distribution system, an RF generator, etc. Examples of measured attributes include impedance, temperature, voltage, pressure, etc.

The root method (essentially the final sub-method) may determine the overall operational readiness state of the plasma processing system. Sub-methods may directly determine the operational readiness state of a particular aspect of the plasma processing system, such as the chuck, which in turn can be incorporated into the root method. Sub-methods may also generate an arbitrary system metrics that are themselves correlated to overall operational readiness state. For example, principal component analysis or partial least squares can be used to analyze process data (i.e., plasma process indicia) in order to determine a correlation to a desired process state. Process data can also include the results of still other sub-methods. The result of each sub-method can be transformed into an expected failure state, which in turn can be mapped to a color and displayed to the operator for action.

In one embodiment, a two-dimensional matrix can be displayed for the plasma processing system operator, wherein each row displays a color map representing a sub-method and each column represents a unit of time. In another embodiment, a two-dimensional matrix can be displayed for the plasma processing system operator, wherein each row displays a color map representing a sub-method and each column represents a defined event (such as the start, middle, end of a sub-step of a plasma process, or any other pre-defined event or time, which may or may not be condition on the value of 1 or more process parameters.

The result of each sub-method, in turn, can be normalized to some set standard, combined to create an aggregate sum-method comprising the previously calculated sub-methods, and then displayed as a color to the operator. This process may be continued in order to achieve a color display for the health of the plasma processing system as a whole.

In determining the overall plasma processing system health, it is often beneficial to determine the expected failure state across a period of time. For example, if a potentially damaging expected failure state is occurring intermittently, it would be beneficial to maintain an overall red state for the plasma processing system, although the most recent calculation did not necessary warrant the red setting.

In another embodiment, the expected failure state value, and hence display color, can be adjusted based on actual nature of the fault. For example, the color green can represent the greatest amount of "optimism" in an expected failure state. That is, a very low likelihood of impact on the plasma process, and therefore likely to be correlated to a "go" state. Likewise, the color red can represent the greatest amount of "pessimism" in an expected failure state. That is, a very high likelihood of impact on the plasma process, and therefore likely to be correlated to a "no go" state.

Generally, the actual nature of the fault may be represented by a numerical metric to which can be determined by rigorous statistical analysis or by empirical engineering experience. For example, a new sub-method for determining faults may be in the process of being tested for effectiveness, and hence should be ignored by the operator. Subsequently, its normalized weight value may be set to zero, or green, for all results. Once the sub-method is validated, its normalized weight value can be subsequently proportionally increased to better represent the actual nature of the fault.

Although continuous colors (e.g. spectral colors) may be used in color maps, other colors choices may be used. Color maps can be used in conjunction with a three-dimensional plot to represent a relationship between four variables. In general, color perception may be described by three descriptors: hue, saturation and brightness. Hue is used to distinguish between colors such as red, green, etc. Saturation describes the purity of the color, while brightness embodies the achromatic notion of intensity. In general, users discern the variations in hue more easily than the variation in brightness or saturation.

In another embodiment, visual analysis of historical events as well as standard numerical or image processing based comparisons can be accomplished.

In another embodiment, multiple sources and multiple types of data may be used to determine expected failure state.

In another embodiment, an expected failure state can be adjusted for other normalized weights, such as impact to operational cost or effect on overall yield.

In another embodiment, complicated or simplified systems with reduced or increased levels of hierarchy can be created. That is, modifications of any level or row of the matrix can be re-calculated with the goal of optimizing that levels correlation with some independent fault detection metric (e.g., more expensive and delayed yield data.) These recalculations may reduce the number of rows with non-zero weight each hierarchy with verified correlation to the independent fault metric as well as historical rates of false positive and false negative alarms which will enable engineering staff and operators to run systems optimized as desired (e.g., as cost effectively or high a throughput as possible).

Figure 2:
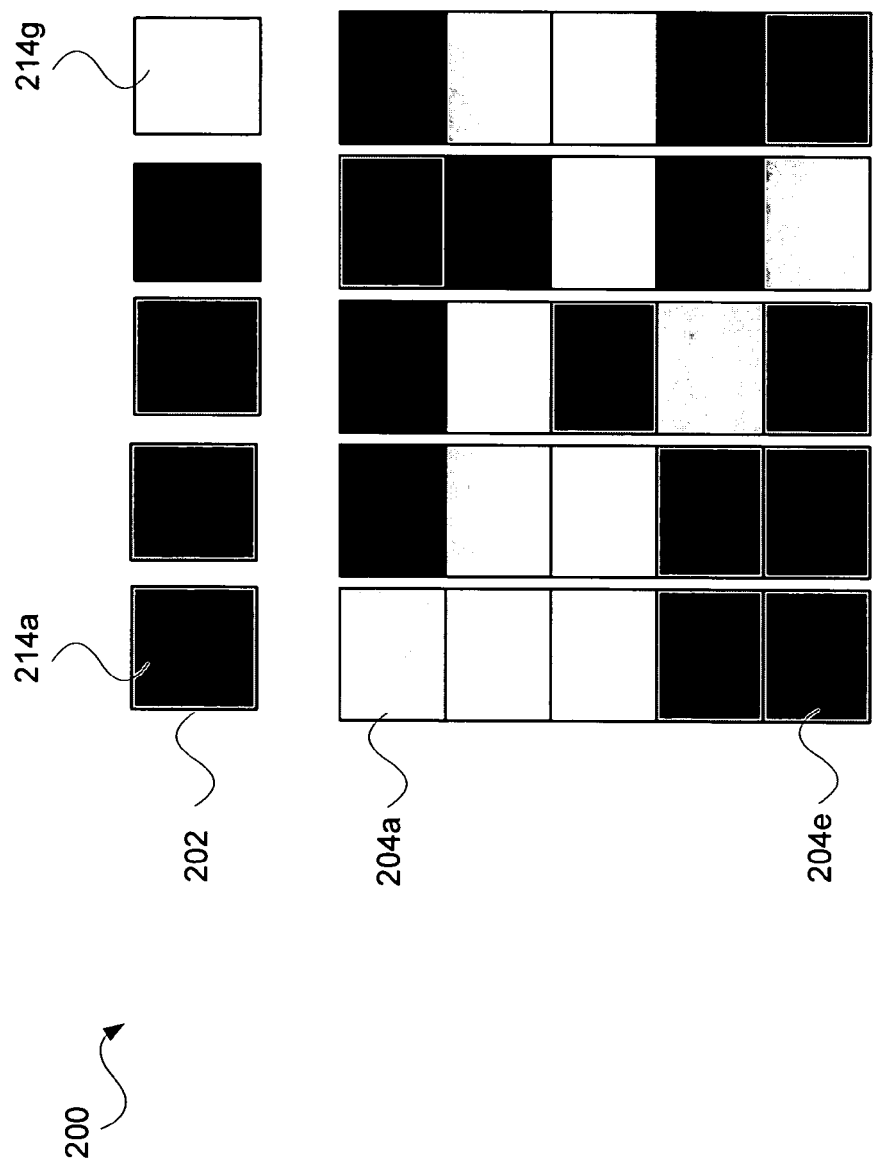
FIG. 2 shows a simplified display of an expected failure state matrix, according to one embodiment of the invention.

Referring now to FIG. 2, a simplified display of an expected failure state matrix is shown, according to one embodiment of the invention. In this example, the display is a n-dimensional matrix including a column dimension of x, a row dimension of y, and a plane dimension of z, wherein x equals 5, y equals 6, and z equals 1. That is, there are 5 columns, 6 rows, and 1 plane.

Each row 204a–e of expected failure state matrix 200 can represent a set of sub-method elements or process models as previously described. Each column 214a–g may represent a particular instance of time in which the set of sub-methods of rows 204a–e is calculated (i.e., every second). In addition, row 202 can represent a root method that incorporates the sub-method elements within a particular column. That is, a normalized aggregation of the individual expected failure states of rows 204. Unlike the light tower of FIG. 1, each display element, in the expected failure state matrix 200 can display a range of colors that represent a continuum of expected failure states.

Figure 3:
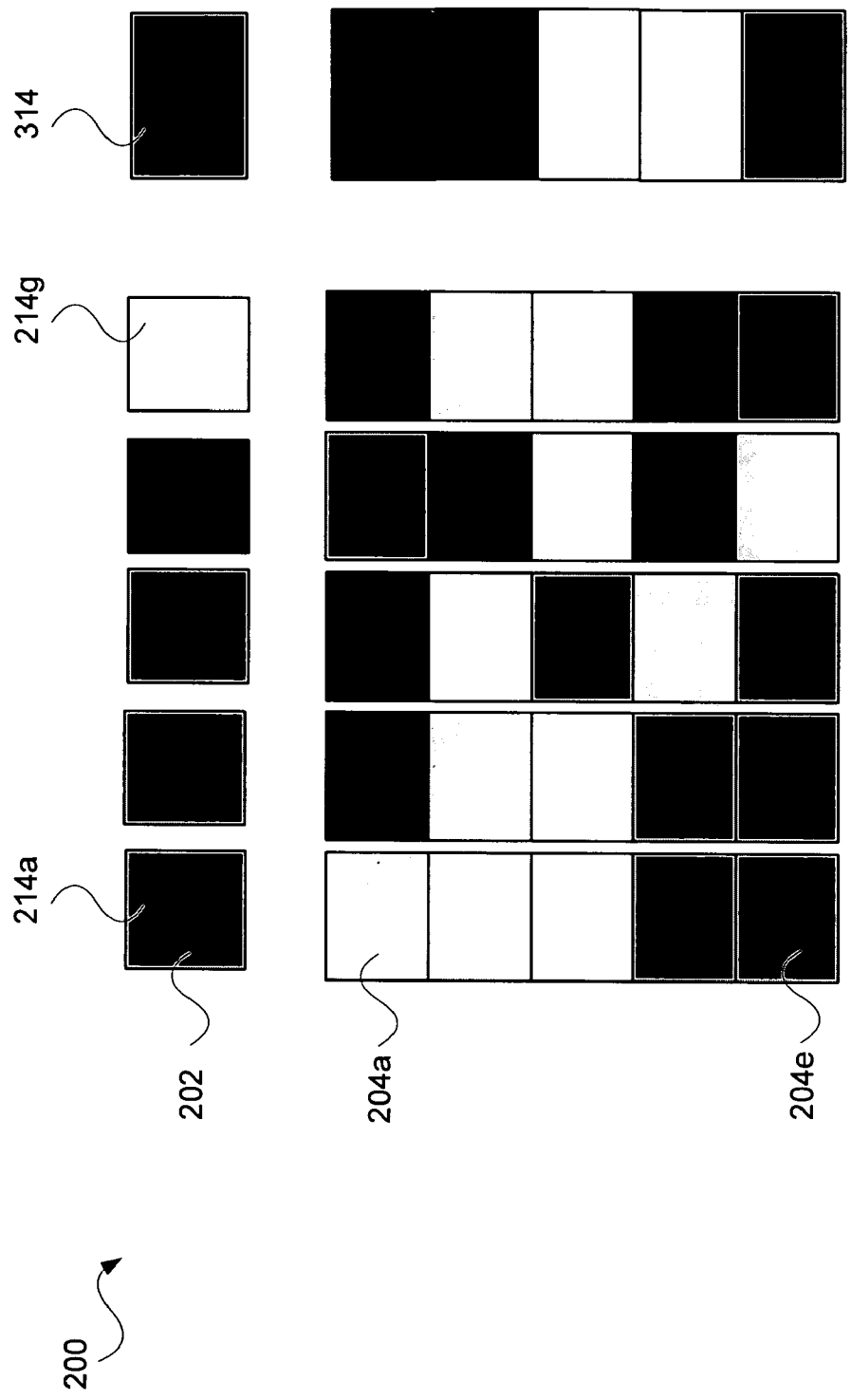
FIG. 3 shows a simplified display of an expected failure state matrix of FIG. 2, with the addition of an overall aggregate column, according to one embodiment of the invention.

Referring now to FIG. 3, a simplified display of an expected failure state matrix of FIG. 2 is shown, with the addition of an overall aggregate column 314, according to one embodiment of the invention. In this example, the display is a n-dimensional matrix including a column dimension of x, a row dimension of y, and a plane dimension of z, wherein x equals 6, y equals 6, and z equals 1. That is, there are 6 columns, 6 rows, and 1 plane.

Figure 4:
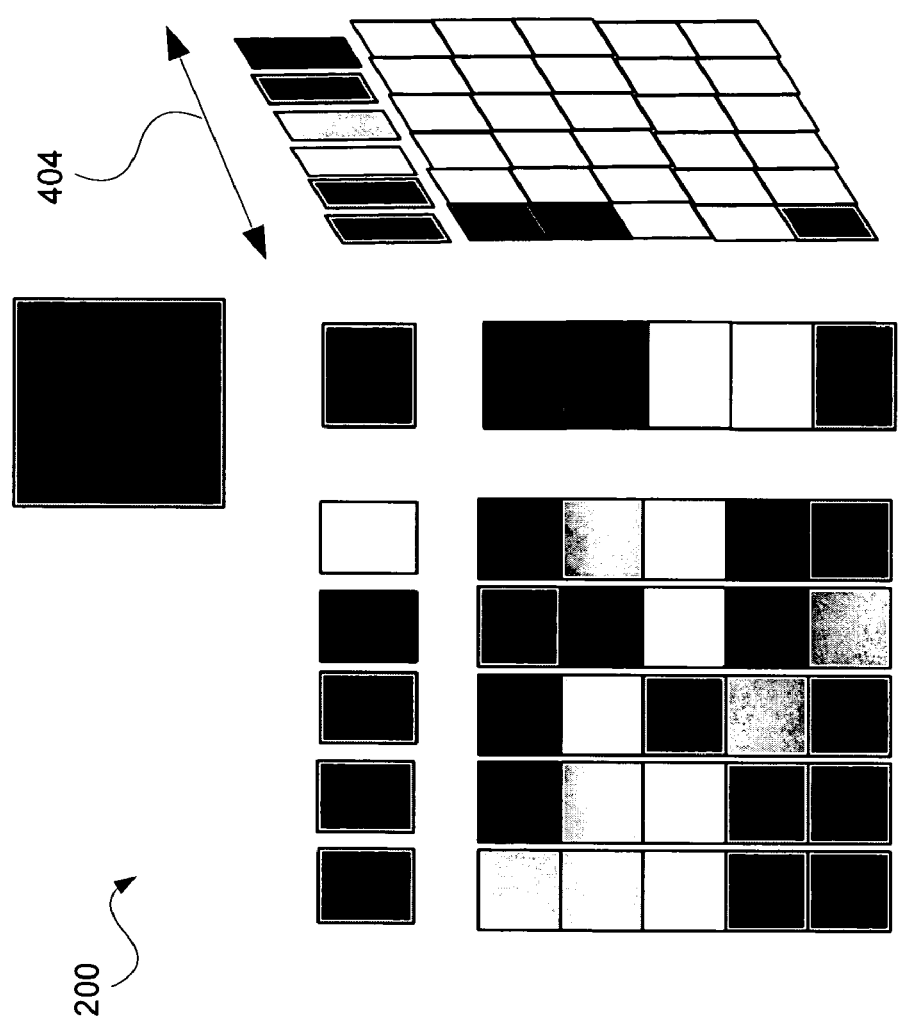
FIG. 4 shows a simplified display of an expected failure state matrix of FIG. 2, with the addition of an additional dimension that allows the display of nested models of models which can evolve, according to one embodiment of the invention.

Referring now to FIG. 4, a simplified display of an expected failure state matrix of FIG. 2 is shown, with the addition of an additional dimension that allow the display of nested models of models which can evolve, according to one embodiment of the invention. In this example, the display is a n-dimensional matrix including a column dimension of x, a row dimension of y, and a plane dimension of z, wherein x equals 6, y equals 6, and z equals 6. That is, there are 6 columns, 6 rows, and 6 planes.

As previously described, an aggregate sub-method can be comprised of other sub-methods. It may be beneficial to allow the operator to navigate or drill down 404 along the plane dimension into the components of the aggregate sub-methods. In one embodiment, expected failure state matrix is scalable beyond three dimensions. In another embodiment, existing applications and procedures can follow this protocol.

Figure 5:
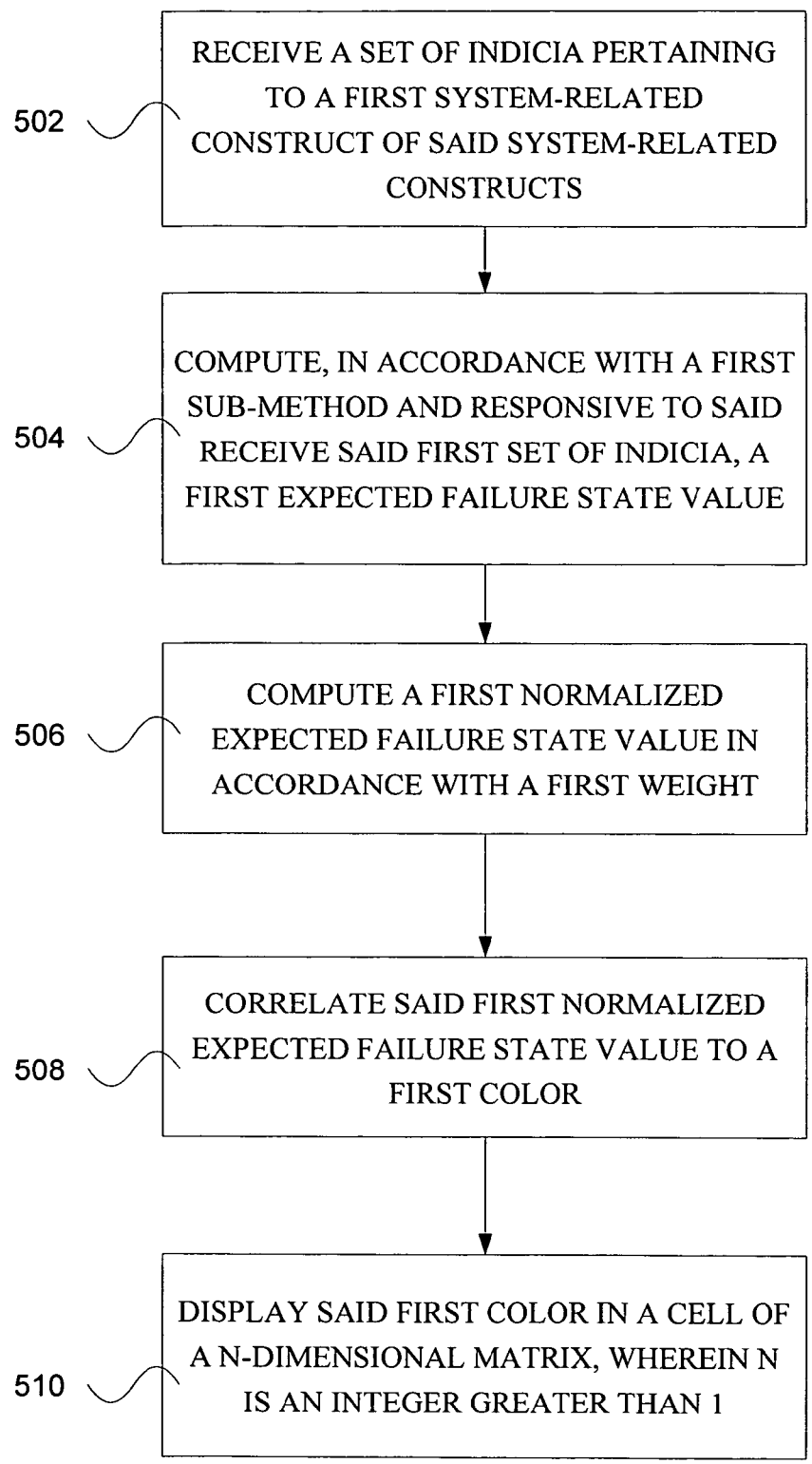
FIG. 5 shows a simplified computer-implemented data presentation technique for presenting a set of expected failure states of system-related constructs pertaining to a plasma processing system, according to one embodiment of the invention.

Referring now to FIG. 5, a computer-implemented data presentation technique for presenting a set of expected failure states of system-related constructs pertaining to a plasma processing system is shown, according to one embodiment of the invention. Initially, a set of indicia is received pertaining to a first system-related construct of the system-related constructs, at step 502. Next, in accordance with a first sub-method and responsive to the receiving the first set of indicia, a first expected failure state value is computed, at step 504. A first normalized expected failure state value is then computed in accordance with a first weight, at step 506. The first normalized expected failure state value is then correlated to a first color, at step 508. And finally, the first color is displayed in a cell of an n-dimensional matrix, wherein n is a integer greater than 1, at step 510.

While this invention has been described in terms of several preferred embodiments, there are alterations, permutations, and equivalents which fall within the scope of this invention. For example, although the present invention has been described in connection with Lam Research plasma processing systems (e.g., Exelan™, Exelan™ HP, Exelan™ HPT, 2300™, Versys™ Star, etc.), other plasma processing systems may be used. This invention may also be used with substrates of various diameters (e.g., 200 mm, 300 mm, LCDs, etc.). It should also be noted that there are many alternative ways of implementing the methods of the present invention.

Advantages of the invention include methods and apparatus for data visualization for a plasma processing system. Additional advantages include the ability to obtain quantitative assessments of proposed model performance; the use of nested models that can evolve; and the use of simple data for complex behind the scenes vendor agnostic analysis.

Having disclosed exemplary embodiments and the best mode, modifications and variations may be made to the disclosed embodiments while remaining within the subject and spirit of the invention as defined by the following claims.

What is claimed is:

1. A computer-implemented data presentation method for presenting a set of expected failure states of system-related constructs pertaining to a plasma processing system:
   receiving a set of indicia pertaining to a first system-related construct of said system-related constructs;
   computing, in accordance with a first sub-method and responsive to said receiving said first set of indicia, a first expected failure state value;
   computing a first normalized expected failure state value in accordance with a first weight;
   correlating said first normalized expected failure state value to a first color;
   displaying said first color in a cell of an n-dimensional matrix, wherein n is an integer greater than 1;
   wherein said n-dimensional matrix includes a column dimension of x, a row dimension of y, and a plane dimension of z, wherein x is an integer greater than 0, y is an integer greater than 0, and z is an integer greater than 0 and wherein said n-dimensional matrix including a second color correlated to a second normalized expected failure state value, and a third color correlated to a third normalized expected failure state value, wherein said third normalized expected failure state value is derived from said first normalized expected failure state value and said second normalized expected failure state value.

2. The computer-implemented data presentation method of claim 1, wherein said first color is computed based on a continuum that includes at least one of a hue value, a brightness value, and a saturation value.

3. The computer-implemented data presentation method of claim 1, wherein said first system-related construct of said system-related constructs pertains to a first sub-component of said plasma processing system.

4. The computer-implemented data presentation method of claim 3, wherein said first sub-component is an electrostatic chuck.

5. The computer-implemented data presentation method of claim 3, wherein said first sub-component is a matching network.

6. The computer-implemented data presentation method of claim 3, wherein said first sub-component is a gas distribution system.

7. The computer-implemented data presentation method of claim 3, wherein said first sub-component is a RF generator.

8. The computer-implemented data presentation method of claim 1, wherein said set of indicia comprises a measurement of a sub-component.

9. The computer-implemented data presentation method of claim 8, wherein said measurement is an impedance measurement.

10. The computer-implemented data presentation method of claim 8, wherein said measurement is a temperature measurement.

11. The computer-implemented data presentation method of claim 8, wherein said measurement is a voltage measurement.

12. The computer-implemented data presentation method of claim 8, wherein said measurement is a pressure measurement.

13. The computer-implemented data presentation method of claim 1, wherein said set of indicia comprises an operational cost of said plasma processing system.

14. The computer-implemented data presentation method of claim 1, wherein said set of indicia comprises at least a second normalized expected failure state value and a measurement of a sub-component.

15. The computer-implemented data presentation method of claim 1, wherein said set of indicia comprises at least a second normalized expected failure state value and a third normalized expected failure state value.

16. The computer-implemented data presentation method of claim 1, wherein each column of said n-dimensional matrix represents a point in time.

17. The computer-implemented data presentation method of claim 1, wherein each column of said n-dimensional matrix represents a periodic calculation time.

18. The computer-implemented data presentation method of claim 1, wherein each column of said n-dimensional matrix represents a predefined event.

19. The computer-implemented data presentation method of claim 18, wherein said predefined event is one of a start event, a stop event, a local maxima event, and a local minima event.

20. The computer-implemented data presentation method of claim 1, wherein said row dimension of y=3, said first color is displayed on a first row, said second color is played on a second row, and a third color is displayed on a third row.

21. The computer-implemented data presentation method of claim 1, further including a fourth color correlated fourth normalized expected failure state value, wherein said third normalized expected failure state value is derived from said first normalized expected failure state value, said second normalized expected failure state value, and also said fourth normalized expected failure state value.

22. The computer-implemented data presentation method of claim 1, wherein said row dimension of y=4, said first color is displayed on a first row, said second color is played on a second row, said third color is displayed on a third row, and said fourth color is displayed on a fourth row.

23. A computer-implemented data presentation method for presenting a set of expected failure states of system-related constructs pertaining to a plasma processing system:
   receiving a set of indicia pertaining to a first system-related construct of said system-related constructs;
   computing, in accordance with a first sub-method and responsive to said receiving said first set of indicia, a first expected failure state value;
   computing a first normalized expected failure state value in accordance with a first weight;
   correlating said first normalized expected failure state value to a first color;
   displaying said first color in a cell of an n-dimensional matrix, wherein n is an integer greater than 1;
   wherein said n-dimensional matrix includes a column dimension of x, a row dimension of y, and a plane dimension of z, wherein x is an integer greater than 0, y is an integer greater than 0, and z is an integer greater than 0 and wherein said n-dimensional matrix including a second color correlated to a second normalized expected failure state value, and a third color correlated to a third normalized expected failure state value, wherein said third normalized expected failure state value is derived from said first normalized expected failure state value and said second normalized expected failure state value;

wherein said first color is computed based on a continuum that includes at least one of a hue value, a brightness value, and a saturation value, and said first system-related construct of said system-related constructs pertains to a first sub-component of said plasma processing system.

24. The computer-implemented data presentation method of claim 23, wherein said n-dimensional matrix further including a fourth normalized expected failure state value, said third normalized expected failure state value is derived using, in addition to said first normalized expected failure state value and said second normalized expected failure state value, said fourth normalized expected failure state value.

25. The computer-implemented data presentation method of claim 23, wherein said set of indicia comprises a measurement of a sub-component.

26. The computer-implemented data presentation method of claim 23, wherein said set of indicia comprises at least a second normalized expected failure state value and a measurement of a sub-component.

27. The computer-implemented data presentation method of claim 23, wherein said row dimension of y=3, said first color is displayed on a first row, said second color is played on a second row, and a third color is displayed on a third row.

28. A computer-implemented data presentation method for presenting a set of expected failure states of system-related constructs pertaining to a plasma processing system:
receiving a set of indicia pertaining to a first system-related construct of said system-related constructs;
computing, in accordance with a first sub-method and responsive to said receiving said first set of indicia, a first expected failure state value;
computing a first normalized expected failure state value in accordance with a first weight;
correlating said first normalized expected failure state value to a first color;
displaying said first color in a cell of an n-dimensional matrix, wherein n is an integer greater than 1;
wherein said n-dimensional matrix includes a column dimension of x, a row dimension of y, and a plane dimension of z, wherein x is an integer greater than 0, y is an integer greater than 0, and z is an integer greater than 0 and wherein if said set of indicia of said n-dimensional matrix comprises at least a second normalized expected failure state value, and said plane dimension of z is greater than 1, said first color can be displayed on a first row and on a first plane of said n-dimensional matrix, and a second color correlated to said second normalized expected failure state value can be displayed on said first row and on a second plane of said n-dimensional matrix.

29. The computer-implemented data presentation method of claim 28, wherein said set of indicia comprises a measurement of a sub-component.

30. The computer-implemented data presentation method of claim 28, wherein said set of indicia comprises at least a second normalized expected failure state value and a measurement of a sub-component.

31. The computer-implemented data presentation method of claim 28, wherein said row dimension of y=3, said first color is displayed on a first row, said second color is played on a second row, and a third color is displayed on a third row.

* * * * *